(12) United States Patent
Koyama et al.

(10) Patent No.: US 6,512,249 B2
(45) Date of Patent: Jan. 28, 2003

(54) LIGHT EMITTING DEVICE, DISPLAY DEVICE, AND ELECTRONIC APPLIANCE

(75) Inventors: Tomoko Koyama, Suwa (JP); Takeo Kaneko, Misato-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/080,692

(22) Filed: Feb. 25, 2002

(65) Prior Publication Data

US 2002/0119384 A1 Aug. 29, 2002

(30) Foreign Application Priority Data

Feb. 26, 2001 (JP) ........................................ 2001-049776
Feb. 25, 2002 (JP) ........................................ 2002-048116

(51) Int. Cl.[7] .......................... H01L 27/15; H01L 31/12
(52) U.S. Cl. .............................. 257/84; 257/79; 257/80
(58) Field of Search .............................. 257/82, 84, 98, 257/79, 80

(56) References Cited

U.S. PATENT DOCUMENTS

| 6,028,327 | A | * | 2/2000 | Mizoguchi et al. | ......... | 257/103 |
| 6,356,691 | B2 | * | 3/2002 | Seong-jin et al. | ........... | 385/116 |
| 6,376,857 | B1 | * | 4/2002 | Imai | ........................... | 250/580 |

FOREIGN PATENT DOCUMENTS

| JP | 03265450 A | * 11/1991 | .......... H02K/19/22 |
| JP | 6-201907 | 7/1994 | |
| JP | 6-224115 | 8/1994 | |
| JP | 7-181689 | 7/1995 | |
| JP | 7-235075 | 9/1995 | |
| JP | 8-248276 | 9/1996 | |
| JP | 10-59743 | 3/1998 | |
| JP | 10-279439 | 10/1998 | |

* cited by examiner

Primary Examiner—Allan R. Wilson
(74) Attorney, Agent, or Firm—Oliff & Berridge, PLC

(57) ABSTRACT

A light emitting device includes a substrate, and a light emitting element section formed over the substrate. The light emitting element section includes a first light emitting layer in which light is generated due to electroluminescence, one pair of electrode layers used to apply an electric field to the first light emitting layer, a second light emitting layer which absorbs light generated in the first light emitting layer and generates light having a longer wavelength than a wavelength of the absorbed light, and one pair of dielectric multilayer films which are formed under and above the second light emitting layer, respectively. A wavelength range of light which is reflected by the pair of dielectric multilayer films includes a wavelength range of light generated in the second light emitting layer.

20 Claims, 12 Drawing Sheets

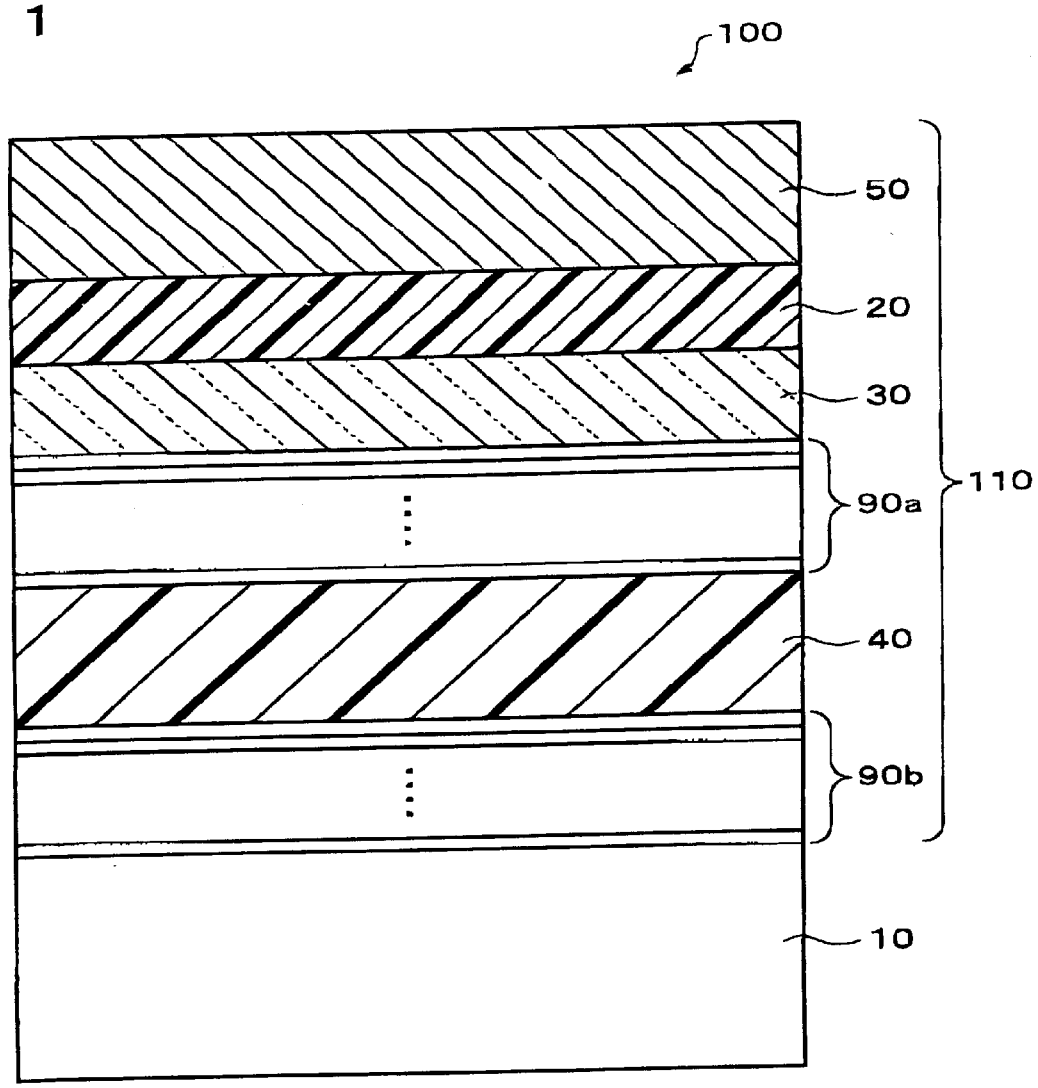

LIGHT EMITTING DEVICE, DISPLAY DEVICE, AND ELECTRONIC APPLIANCE

Japanese Patent Application No. 2001-49776, filed on Feb. 26, 2001, and Japanese Patent Application No. 2002-48116, filed on Feb. 25, 2002, are hereby incorporated by reference in their entirety.

BACKGROUND OF THE INVENTION

The present invention is related to a light emitting device using electroluminescence (EL), and related to a display device and an electronic instrument with employment of this light emitting device.

In EL light emitting elements using the electroluminescence (EL), since light emissions are carried out in an isotropic manner and thus, directivities of the EL light emitting elements are inappropriate, there are the following difficulties. That is, considering a specific direction of the EL light emitting element, intensity of light is lowered and emitted light cannot be utilized in high efficiencies.

BRIEF SUMMARY OF THE INVENTION

The present invention may provide a light emitting device capable of utilizing light in a higher efficiency, while increasing intensity of light along a specific direction.

The present invention may provide a display device using the above-described light emitting device, and an electronic instrument with employment of the light emitting device A light emitting device according to one aspect of the present invention, comprises:

a substrate; and a light emitting element section formed over the substrate, wherein the light emitting element section includes:

a first light emitting layer in which light is generated due to electroluminescence;

one pair of electrode layers used to apply an electric field to the first light emitting layer;

a second light emitting layer which absorbs light generated in the first light emitting layer and generates light having a longer wavelength than a wavelength of the absorbed light; and one pair of dielectric multilayer films which are formed under and above the second light emitting layer, respectively, wherein a wavelength range of light that is reflected by the pair of dielectric multilayer films includes a wavelength range of light generated in the second light emitting layer.

In accordance with this light emitting device, after the light generated in the first light emitting layer due to the electroluminescence is absorbed by the second light emitting layer, light having longer wavelength than that of the absorbed light is generated in the second light emitting layer. The light generated in the second light emitting layer emits through the dielectric multilayer films to the substrate. As a result, it is possible to obtain a light emitting device that can emit light efficiently due to light excitation.

Also, since the wavelength range of the light that is reflected by the dielectric multilayer films includes the wavelength range of the light generated in the second light emitting layer, the light generated in the second light emitting layer is shut up between the dielectric multilayer films, so that the light propagation in the direction intersecting with the surface of the substrate can be restricted. As a result, the light having a very narrow light emission spectral width in the direction intersecting with the surface of the substrate can be obtained efficiently. Further, the light generated in the second light emitting layer may be emitted in a direction intersecting with the substrate, so that a surface light emission may be achieved.

This light emitting device of the present invention may have the following features (1) to (10):

(1) A wavelength range of the light generated in the first light emitting layer and a wavelength range of the light absorbed by the second light emitting layer may at least partially overlap with each other. In this feature, the light generated in the first light emitting layer can be absorbed by the second light emitting layer efficiently.

(2) A wavelength at a highest emission intensity in a wavelength range of the light generated in the second light emitting layer may be longer than a wavelength at a highest emission intensity in a wavelength range of the light generated in the first light emitting layer.

(3) The pair of dielectric multilayer films may include a first dielectric multilayer film and a second dielectric multilayer film, the first dielectric multilayer film maybe formed closer to the first light emitting layer than the second dielectric multilayer film and a reflectance of the first dielectric multilayer film may be larger than a reflectance of the second dielectric multilayer film.

In this feature, the light generated in the second light emitting layer may be emitted from the second light emitting layer toward the substrate.

(4) The first light emitting layer may include an organic light emitting material which emits light by the electroluminescence, (5) The second light emitting layer may include a host material and a dopant material, the host material may absorb the light generated in the first light emitting layer so that an excited state occurs, and the dopant material may be excited due to a transfer of the excited state of the host material to the dopant material, and the excited dopant material may emit light having a longer wavelength than a wavelength of the light absorbed by the host material.

(6) The second light emitting layer may include an organic light emitting material, and the organic light emitting material may absorb the light generated in the first light emitting layer so that the organic light emitting material is excited, and the excited organic light emitting material may emit light having a longer wavelength than a wavelength of the absorbed light, (7) A propagation direction of the light emitted from the first light emitting layer may be substantially equal to a propagation direction of the light emitted from the second light emitting layer (8) This light emitting device may further comprise an optical member which collects the light emitted from the first light emitting layer.

In this feature, since the optical member is formed, after the light emitted from the first light emitting layer is collected, the collected light may be entered into the second light emitting layer. As a result, the utilization efficiency of light may be improved.

In this case, the optical member may be formed between the first light emitting layer and the second light emitting layer.

In this case, the optical member may be a lens layer of refractive index distribution type.

(9) The second light emitting layer may include photonic crystal that restricts light propagated in a surface direction of the substrate.

In accordance with this feature, since the photonic crystal is formed in the second light emitting layer, the light propagates in the surface direction of the substrate can be controlled in the second light emitting layer. Furthermore, the light generated in the first light emitting layer can be utilized in a higher efficiency.

In this case, the surface direction of the substrate implies a direction parallel to a surface of the substrate on which the first and second light emitting layers, and the dielectric multilayer films are stacked.

In this case, a pitch of the photonic crystal may be defined based on a wavelength of the light generated in the second light emitting layer.

(10) The light emitting device may include a plurality of the light emitting element sections, and the second light emitting layers of the emitting element sections may generate light having different wavelengthes.

In this case, the second light emitting layers may be formed in the same level.

In this case, the light emitting element sections may be separated from one another by a bank.

This light emitting device may be applied to a display device. This display device may be applied to various sorts of electronic instruments. This light emitting device may further be applied to various sorts of electronic instruments. A concrete example of the display device and a concrete example of these electronic instruments will be discussed later.

Next, part of materials which may be employed in the respective sections of the light emitting device of the present invention will now be described. Apparently, the described materials merely are part of the materials known in this technical field, other materials than the exemplified materials may be selected.

Firsts and Second Light Emitting Layers

To obtain light having a given wavelength, the materials of the first and second light emitting layers are selected from compounds known in this field. As the materials of the first and second light emitting layers, any one of organic compounds and inorganic compounds may be employed. However, it is desirable to select the organic compounds in view of varieties of material sorts and film forming characteristics thereof.

In this case, materials which are employed in the first and second light emitting layers are selected in such a manner that the wavelength of the light generated in the second light emitting layer is longer than the wavelength of the light in the first light emitting layer. The materials for the first and second light emitting layers maybe selected in such a manner that the wavelength of the light generated in the first light emitting layer at least partially overlaps with the wavelength of the light absorbed by the second light emitting layer. Furthermore, a material in which energy transition is completed at one stage may be employed.

For instance, the first light emitting layer may be formed by employing 8-hydroxyguinoline-aluminum (Alq) and triphenyl-diamine derivative (TPD). In this case, the material of "Alq" has a function as an electron transport layer and another function as a light emitting layer, whereas the material of TPD has a function as a hole transport layer.

Also, the second light emitting layer may be formed from, for example, a material of Alq into which DCM2 has been doped. In this case, the material of DCM2 has a function of a dopant material, whereas the material of Alq owns a function of a host material. Alternatively, the second light emitting layer may be formed by a material of perylene tetracarboxylic acid dianhydride (PTCDA) into which pentacene has been doped. In this alternative case, the material of pentacene has a function of the dopant material, whereas the material of PTCDA has a function of the host material.

Dielectric Multilayer Film

In the light emitting element section, the dielectric multilayer film has a structure that materials whose refractive indexes are different from each other are alternately stacked. As a stacked layer structure, such a structure that a silicon oxide layer ($SiO_2$) and a silicon nitride layer ($SiN_x$) are alternately stacked may be exemplified, for example. Also, the dielectric multilayer film may be formed by alternately stacking two layers selected from. for instance, $TiO_2$, $Ta_2O_5$, $MgF_2$, and ZnS.

Electrode Layer

As the cathode, an electron injection type metal having a small work function (for example, lower than, or equal to 4 eV), an alloy, an electrically conductive compound, and a mixture of these materials may be employed. As an electrode substance, the electrode substance disclosed in Japanese Laid-open Patent Application No 8-248276 (1996) may be employed, for instance.

As the anode, a metal having a large work function (for instance, higher than, or equal to 4 eV), an alloy, an electrically conductive compound, or a mixture made of these materials may be employed. In the case that an optically transparent material is used as the anode, transparent electrically conductive materials such as CuI, ITO, $SnO_2$, and ZnO may be employed. To the contrary, when the transparent characteristic of the anode is not required, a metal such as gold may be employed.

Also, the respective layers constituting the light emitting device may be formed by using the method known in this technical field. For example, as to the respective layers of the light emitting device, suitable film forming methods may be selected, depending upon materials thereof. Specifically, the vapor deposition method, the spin coat method, the LB method, the ink-jet method, and the like may be used

BRIEF DESCRIPTION OF THE SEVERAL VIEWS OF THE DRAWING

FIG. 1 is a sectional view for schematically representing a light emitting device according to a first embodiment of the present invention;

DETAILED DESCRIPTION OF THE EMBODIMENT

First Embodiment
Device Structure

Figure 2A:
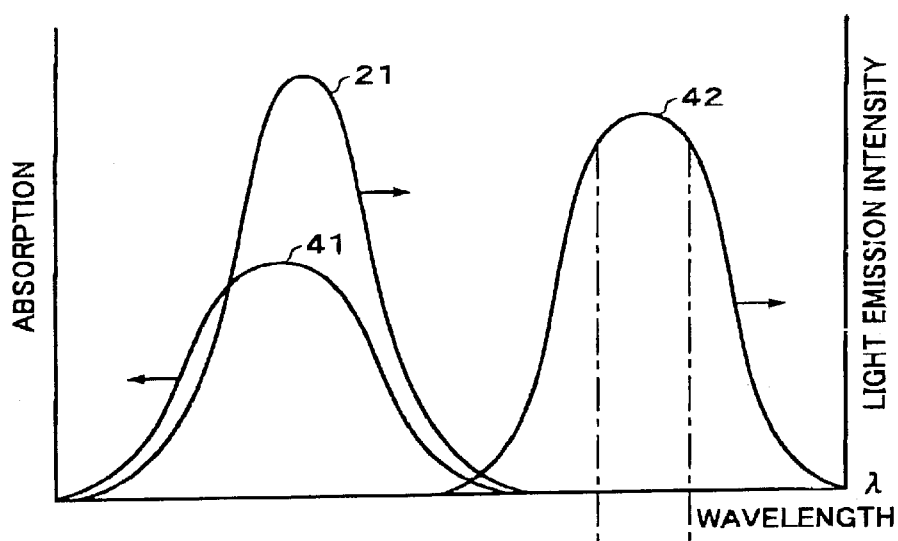
FIG. 2A is a diagram for graphically indicating an example of a wavelength range of light generated in a first light emitting layer shown in FIG. 1, and wavelength ranges of light absorbed by a second light emitting layer and light generated in this second emitting layer shown in FIG. 1.
Figure 2B:
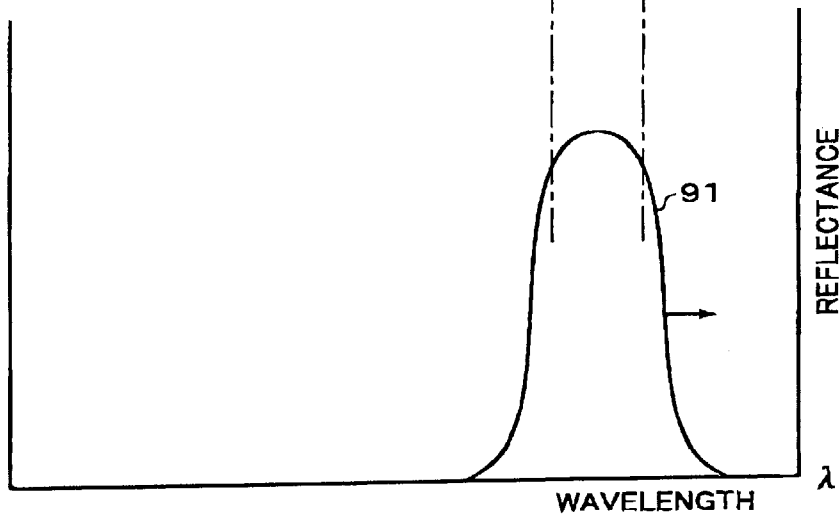
FIG. 2B is a diagram for graphically representing an example of a wavelength range of light reflected by dielectric multilayer films indicated in FIG. 1.

FIG. 1 is a sectional view for schematically indicating a light emitting device 100 according to an embodiment of the present invention. FIG. 2A is a diagram for graphically showing an example as to a wavelength range of light which is generated in a first light emitting layer 20 of the light emitting device 100 indicated in FIG. 1, and wavelength ranges of light absorbed by a second light emitting layer 40 thereof and also light generated in this second light emitting layer 40. FIG. 2B is a diagram for graphically representing an example as to a wavelength range of the light which is reflected from a first dielectric multilayer film 90a and a second dielectric multilayer film 90b of the light emitting device 100 shown in FIG. 1.

The light emitting device 100 has a substrate 10, and a light emitting element section 110 formed on the substrate 10. This light emitting element section 110 has a cathode 50, the above-described first light emitting layer 20, and anode 30, the above-described second light emitting layer 40, and also the above-described first and second dielectric multi-layer films 90a and 9b.

The first light emitting layer 20 is manufactured by a material capable of emitting light therefrom due to the electroluminescence. As the material for constituting the first light emitting layer 20, the above-described materials may be employed.

The anode 30 and the cathode 50 are provided so as to apply an electric field to the first light emitting layer 20. When the electric field is applied to the first light emitting layer 20 by the anode 30 and the cathode 50, light may be generated due to the electroluminescence. The light generated in the first light emitting layer 20 is propagated through the anode 30 and the first dielectric multilayer film 90a, and then, is absorbed by the second light emitting layer 40.

The anode 30 may be constituted by using a transparent conductive material. As a transparent electrode material, the above-described material such as ITO may be employed.

The cathode 50 is formed on the first light emitting layer 20. Since the cathode 50 is formed on the first light emitting layer 20, it is possible to avoid such an operation that the light generated in the second light emitting layer 40 is absorbed by the cathode 50.

Also, the second light emitting layer 40 is formed under the anode 30. Furthermore, one pair of dielectric multilayer films (namely, first and second dielectric multilayer films 90a and 90b) are formed under and above this second light emitting layer 40.

In the second light emitting layer 40, the light generated in the first light emitting layer 20 is absorbed, and thereafter, light having a longer wavelength than that of this absorbed light is emitted. In other words, as graphically shown in FIG. 2A, a wavelength at the highest emission intensity in a wavelength range 42 of the light generated in the second light emitting layer 40 is longer than a wavelength at the highest emission intensity in another wavelength range 21 of the light generated in the first light emitting layer 20.

It should be understood that at least a portion of the wavelength range 21 of the light generated in the first light emitting layer 20 is overlapped with a portion of a wavelength range 41 of the light absorbed by the second light emitting layer 40. In this structure of the light emitting device 100, the light generated in the first light emitting layer 20 can be absorbed by the second light emitting layer 40 in a high efficiency. In order that the light generated in the first light emitting layer 20 may be absorbed by the second light emitting layer 40 in a higher efficiency, as represented in FIG. 2A, the wavelength range 21 of the light generated in the first light emitting layer 20 may be made substantially coincident with the wavelength range 41 of the light absorbed by the second light emitting layer 40.

Also, in the light emitting device 100 according to this first embodiment. the second light emitting layer 40 had a host material and a dopant material. The host material may absorb the light generated in the first light emitting layer 20, and may cause an excited state which occurs due to this light absorption to be Foerster-transferred to the above-described dopant material (note that this excited state is transferred in Foerster transfer mode and Dexter transfer mode, depending upon material under use). As a result, the dopant material is excited and the excited dopant material changes to a state whose energy level is lower than that of this excited state, the above-described dopant material may emit light having a wavelength longer than the wavelength of the light absorbed by the host material.

As the host material and the dopant material, which are capable of realizing an effect, for example, "Alq" may be employed as the host material, and "DCM2" may be employed as the dopant material.

Alternatively, instead of the employment of the above-described host material and dopant material, the second light emitting layer 40 may be formed by employing a single organic light emitting material, while this single organic light emitting material may absorb the light generated in the first light emitting layer 20 and further may emit light having a wavelength longer than the wavelength of the absorbed light. The organic light emitting material is excited by absorbing the light generated in the first light emitting layer 20, and when the state of this excited organic light emitting material changes to a state of lower energy level, this organic light emitting material may emit the light having a wavelength longer than that of the above-described light absorbed by this organic light emitting material.

The first dielectric multilayer film 90a and the second dielectric multilayer film 90b are made of such a structure that materials having refractive indexes different from each other are alternately stacked, for instance, which is similar to a stacked layer made of a silicon oxide layer and a silicon nitride layer. Each of layers which are alternately stacked may be formed in such a manner that a thickness of each layer is made nearly equal to "$\lambda/(4n)$." In this formula, symbol "$\lambda$" indicates a given wavelength located within the wavelength range 42 of the light generated in the second light emitting layer 40, and symbol "n" denotes a refractive index of the film.

The first dielectric multilayer film 90a and the second dielectric multilayer film 90b reflect thereon the light having a wavelength located in a given wavelength. In other words, a given wavelength range implies a wavelength range of light which is reflected by the first dielectric multilayer film 90a and the second dielectric multilayer film 90b. The wavelength ranges of the light which is reflected by the first and second dielectric multilayer films 90a and 90b are defined based upon the wavelength range of the light generated in the second light emitting layer 40. As a consequence, as indicated in FIG. 2B, the first and second dielectric multilayer films 90a and 90b are formed in such a manner that a reflectance 91 of the light reflected by the first and second dielectric multilayer films 90a and 90b is included in the wavelength range 42 of the light generated in the second light emitting layer 40. In accordance with this structure, since the light generated in the second light emitting layer 40 can be enclosed between the first dielectric multilayer film 90a and the second dielectric multilayer film 90b, it is possible to increase alight emitting efficiency in this given wavelength. In order to furthermore increase this light emitting efficiency, the wavelength range of the light which is reflected by the first and second dielectric multilayer films 90a and 90b may be made substantially equal to the wavelength range of the light generated in the second light emitting layer 40.

Also, in the light emitting device 100 according to this first embodiment, the first dielectric multilayer film 90a and the second dielectric multilayer film 90b are formed in such a manner that the reflectance of the first dielectric multilayer film 90a becomes larger than the reflectance of the second dielectric multilayer film 90b. In this case, the first dielectric multilayer film 90a implies one of the dielectric multilayer films which is formed closer to the first light emitting layer 20 than the other dielectric multilayer film. In accordance with this structure, the light emitted from the second light emitting layer 40 may be emitted from the second light emitting layer 40 toward the substrate 10.

In the light emitting device 100 according to this first embodiment, since the light emitted from the second light emitting layer 40 is enclosed between the first and second dielectric multilayer films 90a and 90b, the propagation of the light along a direction intersecting with the surface of the substrate 10 may be controlled.

Also, in the light emitting device 100 according to this first embodiment, the first light emitting layer 20 and the second light emitting layer 40 are manufactured in such a manner that the propagation direction of the light emitted from the first light emitting layer 20 becomes substantially equal to the propagation direction of the light emitted from the second light emitting layer 40.

Device Operation

Next, operations of this light emitting device 100 will now be explained.

Since a preselected electric field is applied between the anode 30 and the cathode 50, electrons are injected from the cathode 50 into the first light emitting layer 20 and also holes are injected from the anode 30 into this first light emitting layer 20. Since the electrons and the holes are recoupled with each other within the first light emitting layer 20, excitons are produced. When the excitons are deactivated, light may be emitted.

Subsequently, the light generated in the first light emitting layer 20 is emitted from the first light emitting layer 20, and is propagated through the anode 30 and the first dielectric multilayer film 90a to be entered into the second light emitting layer 40. In this case, the light entered into the second light emitting layer 40 is absorbed by the host material included in the second light emitting layer 40. The excited state which is produced by absorbing this light is moved to the dopant material in the Foerster movement, so that the above-described dopant material is excited. When the excited state of this excited dopant material changes to the state whose energy level is lower than that of the excited dopant material, light may be emitted. At this time, this emitted light has a longer wavelength than that of the light which is absorbed by the host material. After the light generated in this second light emitting layer 40 has been enclosed between the first dielectric multilayer film 90a and the second dielectric multilayer film 90b, the light may be emitted from the second light emitting layer 40 toward of the substrate 10.

Effect

In accordance with the light emitting device 100 of this first embodiment, the light which is generated in the first emitting layer 20 due to the electroluminescence is absorbed by the second light emitting layer 40, and thereafter, the light having the longer wavelength than that of this absorbed light is generated in the second light emitting layer 40. In other words, after the charge injected into the first light emitting layer 20 has been converted into the light in the high efficiency, the material included in the second light emitting layer 40 is excited by this light. Thereafter, in the case the excited state of this material changes to the state whose energy level is lower than that of this excited state, this excited material may emit the light having the longer wavelength than that of the light converted in the first light emitting layer. This light is propagated through the first and second dielectric multilayer films 90a and 90b, and then, is emitted to the substrate 10. As a result, it is possible to obtain the light emitting device capable of emitting the light in a high efficiency by the light excitation.

Also, in accordance with the light emitting device 100 of this first embodiment, since the wavelength range of the light reflected by the first and second dielectric multilayer films 90a and 90b involves the wavelength of the light generated in the second light emitting layer 40, the light generated in the second light emitting layer 40 is enclosed between the first and second dielectric multilayer films 90a and 90b, so that the propagation of the light along the direction intersecting with the surface of the substrate 10 can be controlled. In other words, the spontaneous emission of the light along the direction intersecting with the surface of the substrate 10 may be restricted by the first and second dielectric multilayer films 90a and 90b. As a consequence, in the direction intersected with the surface of the substrate 10, light whose emission spectral width is very narrow can be obtained in the high efficiency. Also, since the light may be emitted along the direction intersected with the surface of the substrate 10, a so-called "surface light emission" may be achieved Furthermore, the first dielectric multilayer film 90a is formed adjacent to the cathode 30 in the light emitting device 100. As a consequence, since the second light emitting layer 40 is formed apart from the cathode 30, the absorption amount of the light generated in the second light emitting layer 40 by the cathode 30 can be reduced.

On the other hand, in the case the light emitting device 100 according to this first embodiment is employed in a display device (will be explained later), the light is required to be emitted to the substrate 10 so as to improve the utilization efficiency of the light. In the light emitting device 100 according to this first embodiment, the reflectance of the first dielectric multilayer film 90a is made larger than the reflectance of the second dielectric multilayer film 90b. As a result, since the light can be emitted to the substrate 10 with a top priority, the utilization efficiency of the light can be increased. As a consequence, the light emitting device 100 according to this first embodiment may be applied to a display device.

Display Device and Electronic Instrument

The light emitting device 100 according to this first embodiment may be applied to a display device 500. This display device 500 having the light emitting device 100 may be applied to an electronic instrument. FIG. 7 to FIG. 12 are perspective views schematically showing an example of electronic instruments to which the display device 500 having the light emitting device 100 is applied, respectively. It should also be noted that not only the light emitting device 100 of this first embodiment, but also other light emitting devices 200 to 400 according to a second embodiment through a fourth embodiment of the present invention (will be discussed later) are applied to the display device 500.

Figure 7:
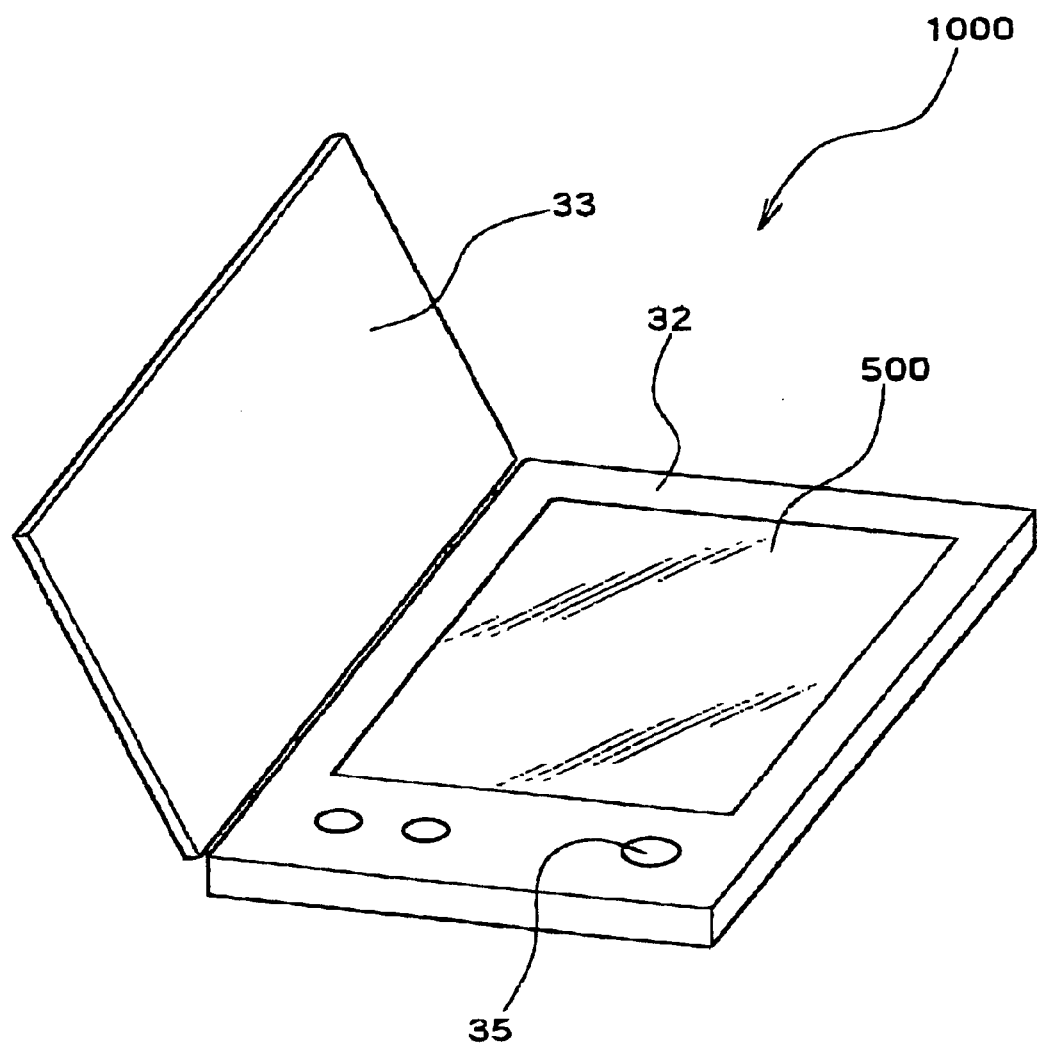
FIG. 7 is a perspective view for representing a structure of an electronic book which constitutes one example of an electronic instrument according to the present invention.

FIG. 7 is a perspective view showing a construction of an electronic book 1000 as an example of an electronic instrument according to this embodiment. The electronic book 1000 has a book-shaped frame 32, and a cover 33 which can be opened/closed on this frame 32. The display device 500 is provided on this frame 32 under a condition that a display surface of this display device 500 is exposed from a surface of this frame 32. Further, an operation section 35 is provided on this frame 32. A controller, a counter, and a memory (not shown) are provided in the frame 32. In this embodiment, the display device 500 is equipped with a pixel section (not shown) formed by filling thin elements with electronic ink, and a peripheral integrated circuit (not shown) that is unified with this pixel section. This peripheral circuit is provided with a decoding type scan driver and a data driver.

Figure 8:
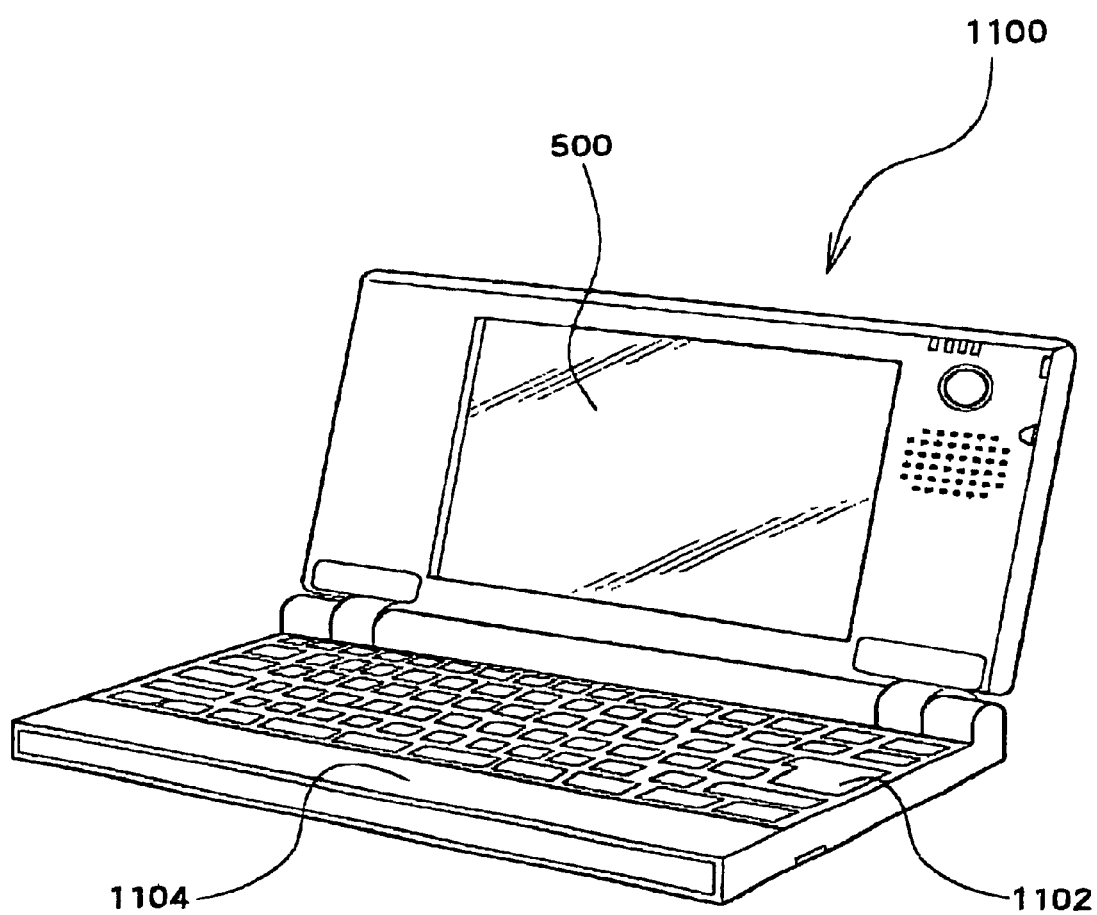
FIG. 8 is a perspective view for representing a structure of a personal computer which constitutes another example of the electronic instrument according to the present invention.

FIG. 8 is a perspective view showing a construction of a personal computer 1100 as another example of the electronic instrument according to this embodiment. The personal computer 1100 includes a main body 1104 equipped with a keyboard 1102, and a display section eqipped with the above-described display device 500.

Figure 9:
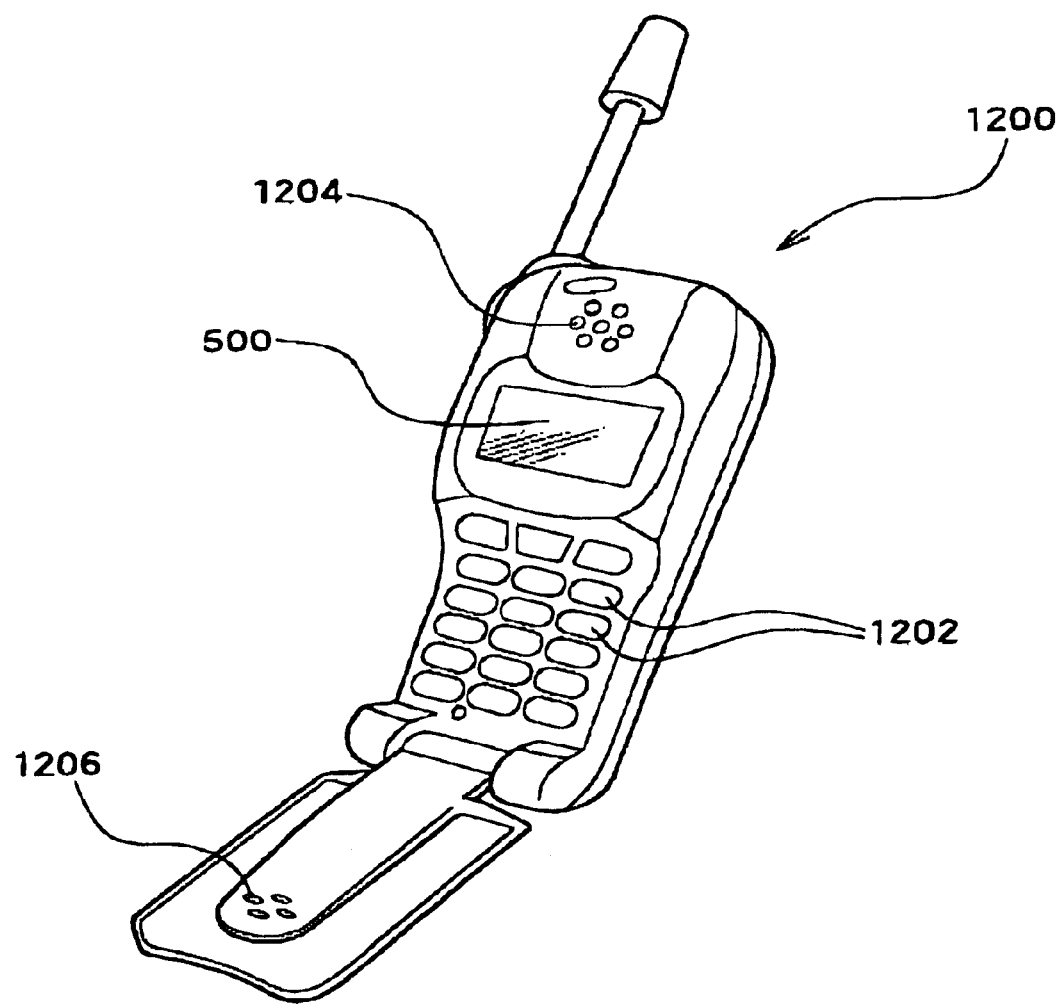
FIG. 9 is a perspective view for representing a structure of a portable telephone which constitutes another example of the electronic instrument according to the present invention.

FIG. 9 is a perspective view showing a construction of a portable telephone 1200 as another example of the electronic instrument according to this embodiment. This portable telephone 1200 is equipped with the above-described display device 500, and a receiver 1204, a transmitter 1206, in addition to a plurality of operation buttons 1202.

Figure 10:
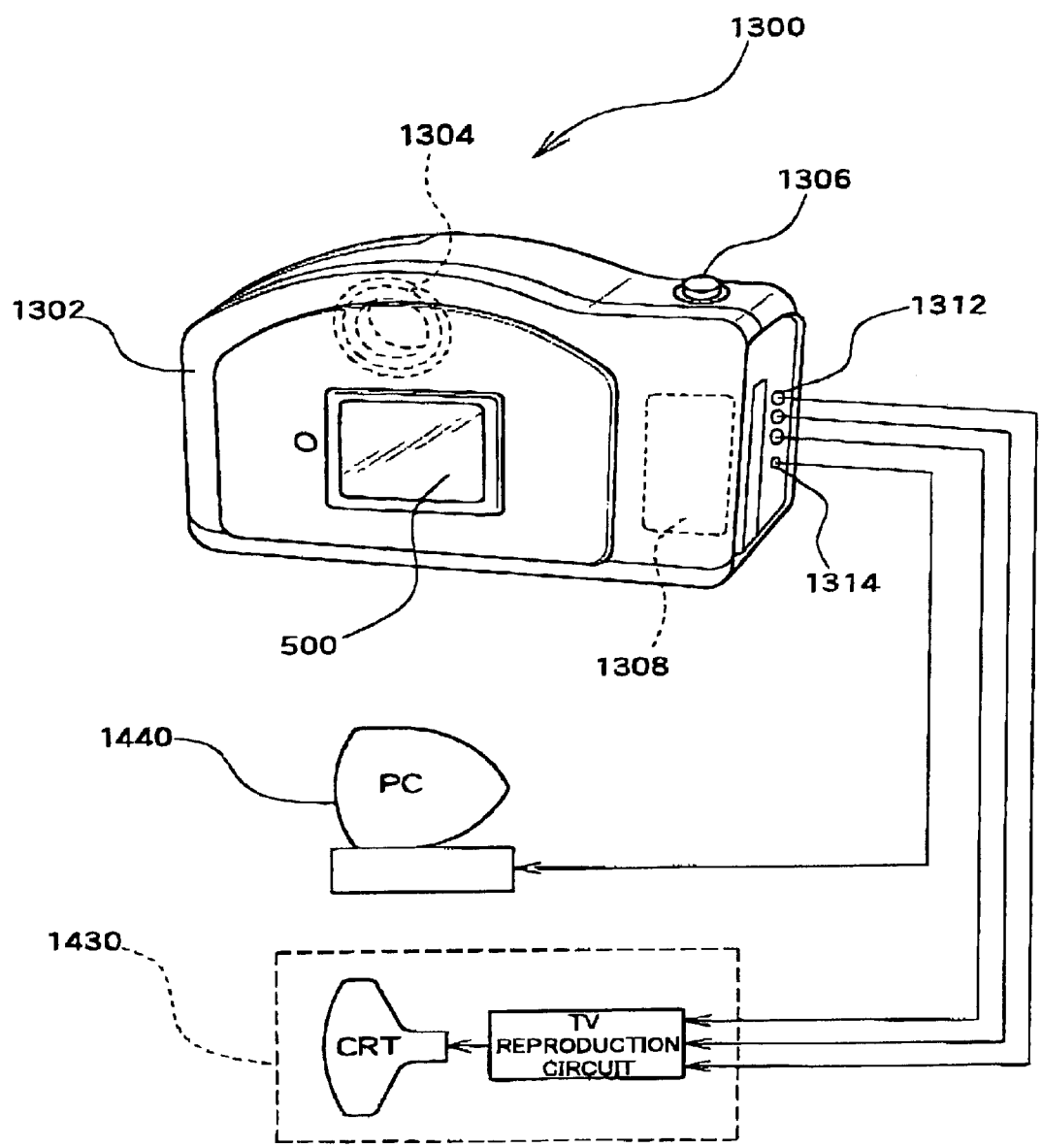
FIG. 10 is a perspective view for indicating a structure of the back side of a digital still camera which constitutes another example of the electronic instrument according to the present invention.

FIG. 10 is a perspective view showing a construction of a digital still camera 1300 as another example of the electronic instrument according to this embodiment. FIG. 10 shows the construction of the digital still camera 1300, and further, a connection between the digital still camera 1300 and an external electronic instrument in a simple manner.

A photographic camera usually exposes a film by using an optical image of an object, but the digital still camera 1300 conducts electro-optical conversion of an optical image of an object using CCD and generates an image signal. In this camera structure, the above-described display device 500 is provided on the back side of the digital still camera 1300, and displays an object based on the. image signal from CCD. In other words, the display device 500 functions as a finder to display an object. A light receiving section 1304 including an optical lens, the CCD, or the like is provided on an viewer side (namely, a back side in FIG. 10) of the case 1302. In the case that a photographer confirms an object displayed on the display device 500 and depresses a shutter bottom 1306, the image signal from the CCD at this time instant is transferred and stored into a memory of a circuit board 1308. A video signal output terminal 1312 and an input/output element 1314 used for data communications are provided on a side surface of the case 1302 of this digital still camera 1300. Then, as indicated in FIG. 10, a TV monitor 1430 is connected to the video signal output element 1312, and a personal computer 1440 is connected to the input/output element 1314 used for data communications, if required. Furthermore, the image signal stored in the memory of the circuit board 1308 can be outputted to the TV monitor 1430 or the personal computer 1440 by the given operation.

Figure 11:
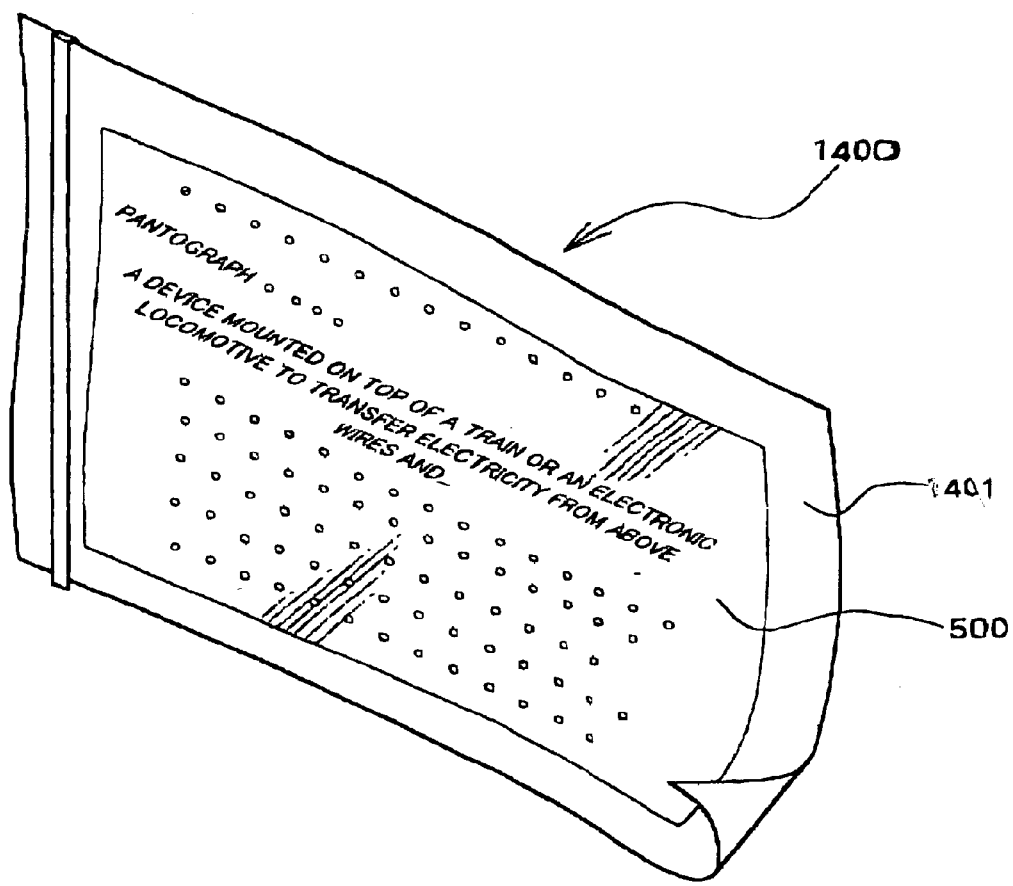
FIG. 11 is a perspective view for representing a structure of electronic paper which constitutes one example of the electronic instrument according to the present invention.

FIG. 11 is a perspective view showing a construction of electronic paper 1400 as another example of the electronic instrument according to this embodiment. In FIG. 11, the electronic paper 1400 includes a main component 1401 formed of a rewritable sheet having a feel and flexibility similar to a real paper, and a display section equipped with the above-described display device 500.

Figure 12:
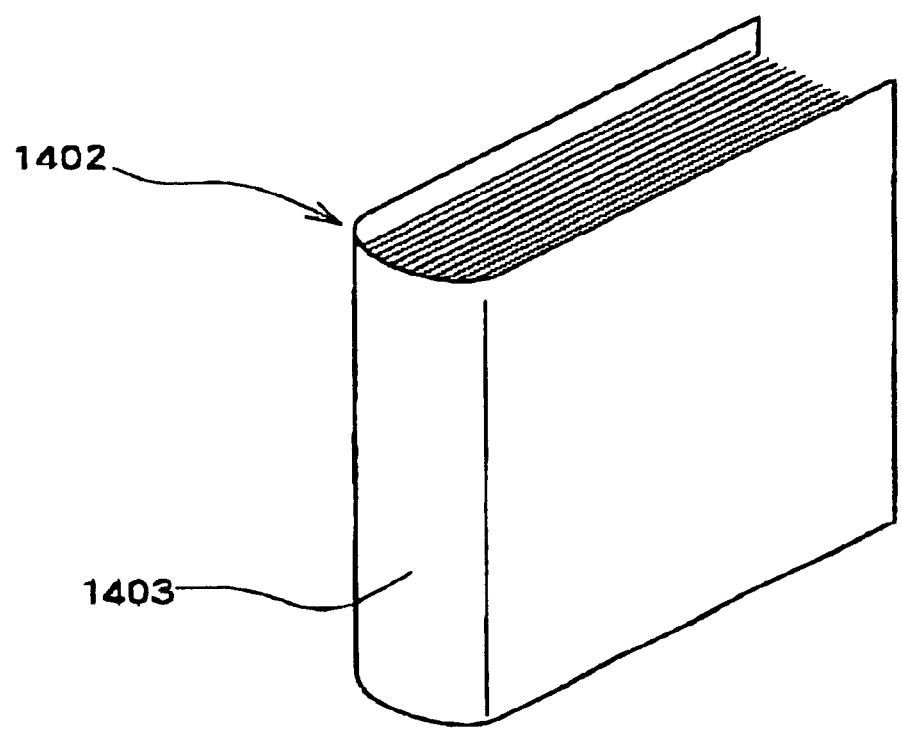
FIG. 12 is a perspective view for representing a structure of an electronic notebook which constitutes another example of the electronic instrument according to the present invention.

FIG. 12 is a perspective view showing a construction of an electronic notebook 1402 as another example of the electronic instrument according to this embodiment. As shown in FIG. 12, the electronic notebook 1402 has a plurality of sheets of the electronic paper 1400 of FIG. 11 bound by a cover 1403. The electronic notebook 1402 can change displayed content of the electronic paper 1400 in a bound state by providing a display data input means in the cover 1403.

In addition to these electronic book 1000 of FIG. 7. personal computer 1100 of FIG. 8, portable phone 1200 of FIG. 9, digital still camera 1300 of FIG. 10, electronic paper 1400 of FIG. 11 and electronic notebook 1402 of FIG. 12, it should be noted that various other instruments such as a liquid crystal TV, a view-finder or monitor type of video tape recorder, a car navigation device, a pager, an electronic pocket notebook, an electronic calculator, a wordprocessor, a workstation, a TV phone, a POS terminal, an IC card, a mini-disk player, or a device provided with a touch panel can be provided as other examples. It goes without saying that the display device 500 can be used as a display unit of these electronic instruments.

Second Embodiment
Device Structure

Figure 3:
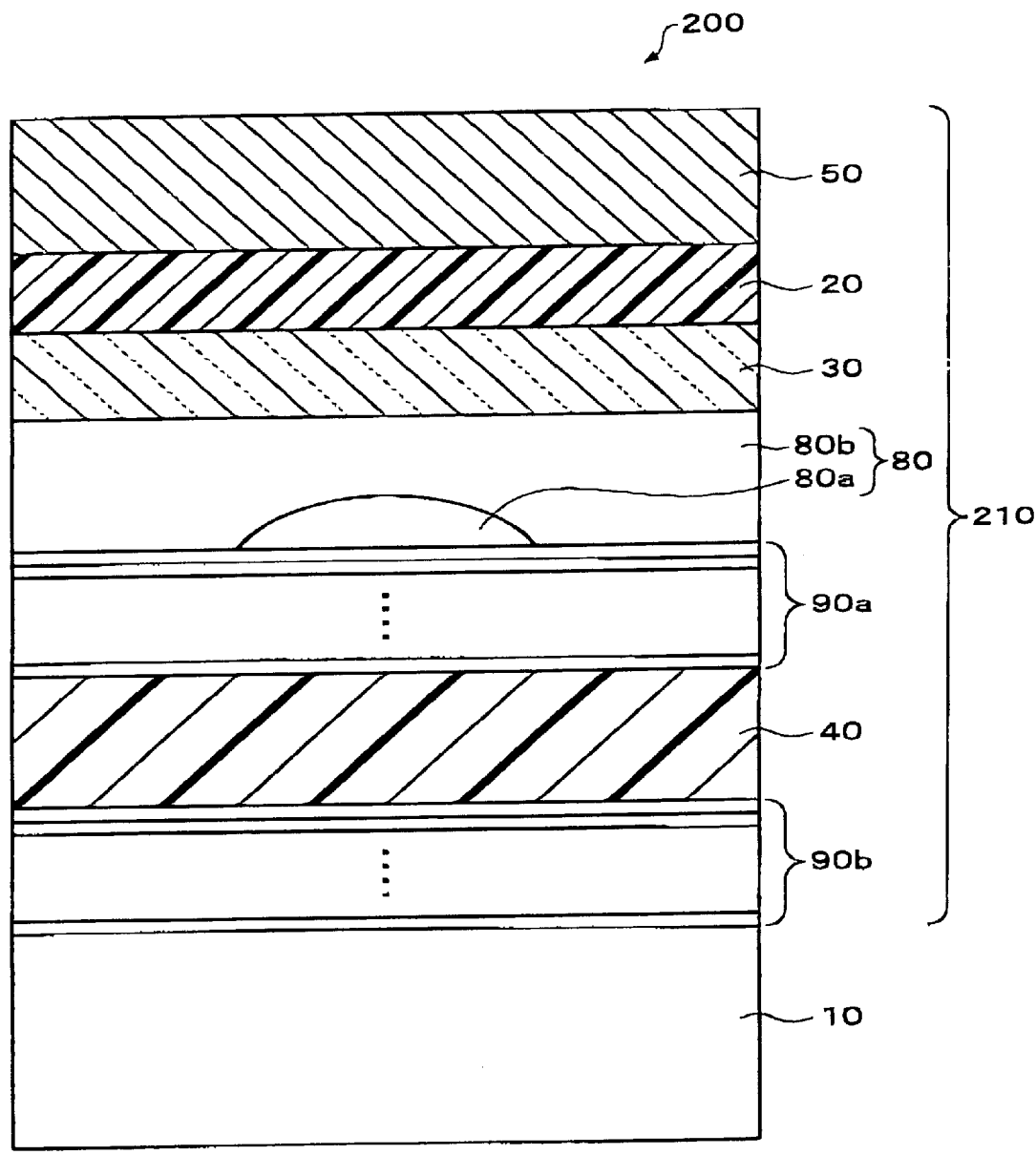
FIG. 3 is a sectional view for schematically showing a light emitting device according to a second embodiment of the present invention.

FIG. 3 is a sectional view for schematically indicating a light emitting device 200 according to a third embodiment of the present invention.

The light emitting device 200 has a substrate 10, and a light emitting element section 210 formed on the substrate 10. The light emitting device 200 has a different structure from that of the light emitting device 100 according to the first embodiment. That is, an optical member capable of collecting light emitted from the first light emitting layer 20 is provided between the anode 30 and the first dielectric multilayer film 90a. Other constructions of this light emitting device 200 are similar to those of the above-described light emitting device 100 according to the first embodiment, and therefore, explanations thereof are omitted.

A lens layer 80 owns a function as the optical member capable of collecting light emitted from the first light emitting layer 20. The lens layer 80 is constituted by a high refractive index section 80a and a low refractive index section 80$_b$, and has a function as a refractive-index distribution type lens. In this case, a refractive index of the high refractive index section 80a is larger than a refractive index of the low refractive index section 80b. The high refractive index section 80a has a convex shape, and is formed on the first dielectric multilayer film 90a. Also, the low refractive index section 80b is formed in such a manner that the high refractive index section 80a is embedded into this low refractive index section 80b. As a manufacturing method of this lens layer 80, the below-mentioned manufacturing methods may be employed:

(1) First, fluid-shaped articles of resin are jetted on the first dielectric multilayer film 90a by using either a dispenser nozzle or an ink-jet head, the fluid-shaped articles are positioned on the first dielectric multilayer film 90a, and thereafter, are hardened, so that the high refractive index section 80a is formed. The fluid-shaped articles of the resin used in this manufacturing method may be selected from the fluid-shaped article having a precursor of the above-described thermosetting resin, or a precursor of ultraviolet hardening type resin. In this case, the above-described fluid-shaped articles are hardened in accordance with characteristics of these fluid-shaped articles. Subsequently, the low refractive index section 80b is stacked in such a manner that the high refractive index section 80a is embedded into this low refractive index section 80b. Then, the lens layer 80 constructed of the high refractive index section 80a and the low refractive index section 80b may be formed in accordance with the above-described manufacturing steps.

(2) As a material used to manufacture the lens layer 80, quartz glass into which germanium has been added is employed. Ultraviolet rays are emitted to a layer made of this quartz glass so as to manufacture a portion having a high refractive index. In this case, a glass layer portion whose refractive index is increased by irradiating the ultraviolet rays within this quartz glass layer may constitute the high refractive index section 80a, whereas the remaining glass layer portion may constitute the low refractive index section 80b. Thus, the lens layer 80 is manufactured in accordance with the above-described manufacturing steps.

It should also be noted that the optical member capable of collecting the light emitted from the first light emitting layer 20 is not limited to the lens layer 80, but any other members may be employed which has a function capable of collecting the light emitted from the first light emitting layer 20.

Device Operation

Next, operations of this light emitting device 200 will now be explained.

Since a preselected electric field is applied between the anode 30 and the cathode 50, electrons are injected from the cathode 50 into the first light emitting layer 20 and also holes are injected from the anode 30 into this first light emitting layer 20. Since the electrons and the holes are recoupled with each other within the first light emitting layer 20, excitons are produced. When the excitons are deactivated, light may be emitted.

Subsequently, the light generated in the first light emitting layer 20 is emitted from the first light emitting layer 20, and is entered into the lens layer 80. This entered light is collected by the high refractive index section 80a, and thereafter, is propagated through the first dielectric multilayer film 90a to be entered into the second light emitting layer 40. The succeeding operations and effects of this light emitting device 200 are similar to those of the light emitting device 100 according to the first embodiment, and therefore, explanations thereof are omitted.

Effect

While the light emitting device 200 of the second embodiment owns operations and effects which are substantially similar to those of the light emitting device 100 of the first embodiment, since the lens layer 80 is formed between the first light emitting layer 20 and the second light emitting layer 40, the light emitted from the first light emitting layer 20 can be collected and thereafter can be entered into the second light emitting layer 40. As a result, the utilization efficiency of the light can be improved.

Third Embodiment

Device Structure

Figure 4:
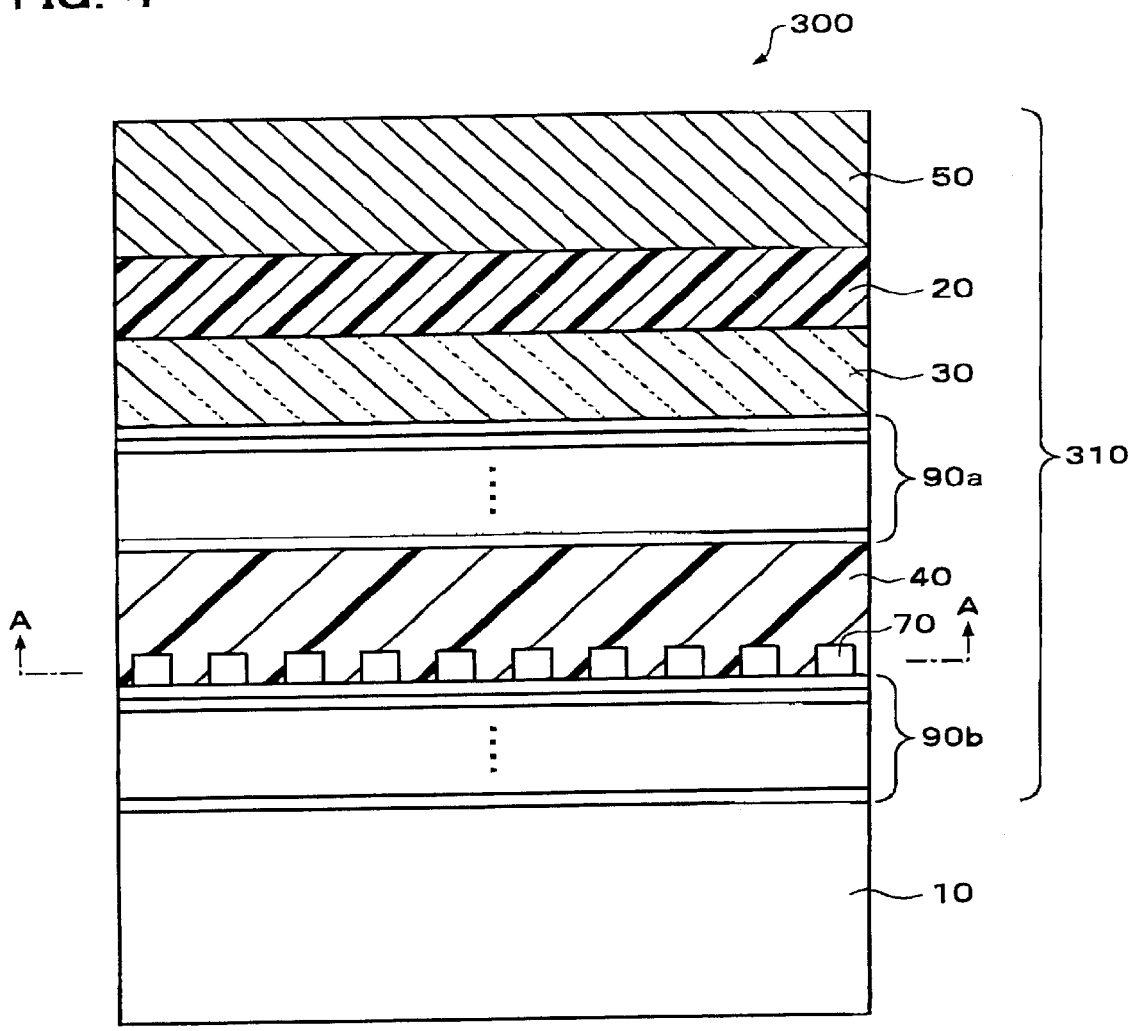
FIG. 4 is a sectional view for schematically showing a light emitting device according to a third embodiment of the present invention.
Figure 5:
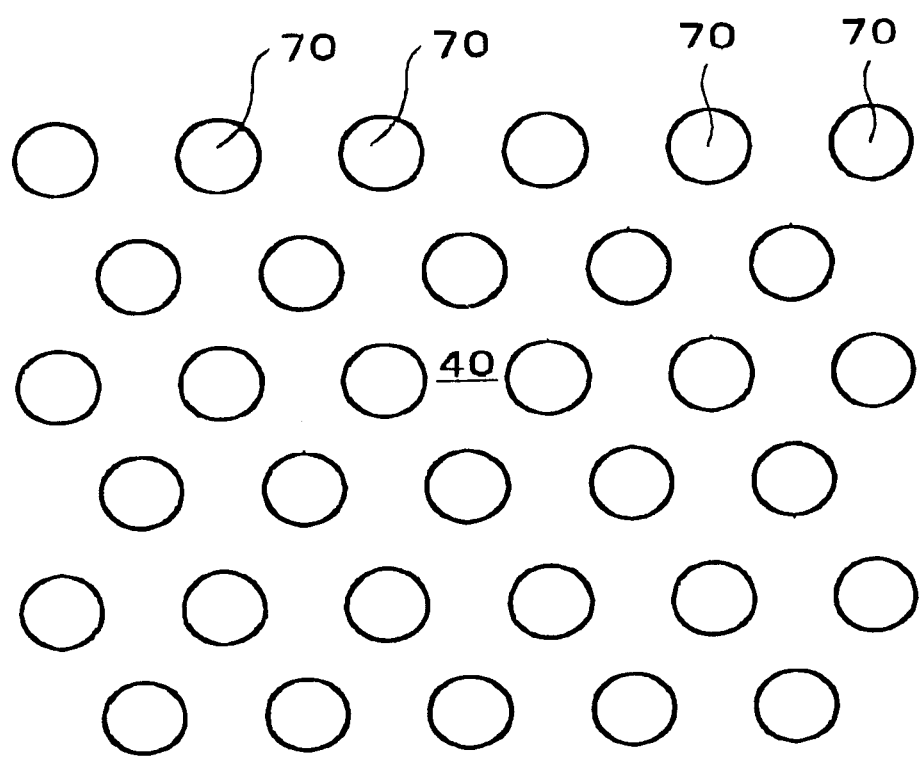
FIG. 5 is a schematic diagram for illustratively showing a section of the light emitting device, taken along a line A—A of FIG. 4.

FIG. 4 is a sectional view for schematically indicating a light emitting device 300 according to a third embodiment of the present invention. FIG. 5 is a sectional view showing this light emitting device 300, taken along a line A—A of FIG. 4.

As indicated in FIG. 4, the light emitting device 300 has a substrate 10, and a light emitting element section 310 formed on this substrate 10. The light emitting device 300 owns a different structure from that of the light emitting device 100 according to the first embodiment. That is, photonic crystal 70 is provided inside a second light emitting layer 40. other structural elements of this light emitting device 300 are similar to those of the light emitting device 100 according to the first embodiment, and therefore, descriptions thereof are omitted.

In the light emitting device 300, the photonic crystal 70 is arranged in a preselected pitch. As represented in FIG. 4 and FIG. 5, in the light emitting device 300 of this third embodiment, such an example is illustrated. That is, the photonic crystal 70 is arranged in a triangular-lattice shape. The pitch of the photonic crystal 70 may be defined based upon a wavelength of light which is generated in the second light emitting layer 40. Assuming now that an effective refractive index in the second light emitting layer 40 is equal to "$n_{eff}$", the pitch "d" of this photonic crystal 70 is formed as follows:

$$d=\lambda/4n_{eff}$$

In this equation, symbol "$\lambda$" indicates a given wavelength of light whose wavelength is located within the wavelength 42 of the light emitted from the second light emitting layer 40. Also, $n_{eff}=n_1*n_2/(n_1+n_2)$ in which symbols "$n_1$" and "$n_2$" indicate refractive indexes of two sorts of media which constitute the photonic crystal. As described above, since the pitch of the photonic crystal 70 is defined based upon the wavelengths of the light generated in the second light emitting layer 40, the light which is propagated along a direction of a surface of the substrate 10 in the second light emitting layer 40 may be restricted. It should also be noted that this surface direction of the substrate 10 implies a direction which is located in parallel to a surface in the substrate 10, on which the first and second light emitting layers 20 and 40, and also the first and second dielectric multilayer films 90a and 90b and the like are stacked.

There is no specific limitation in a method for manufacturing the above-described photonic crystal 70, and therefore, the forming methods known in this technical field may be employed. Typical forming methods of this photonic crystal 70 will now be exemplified as follows:

(1) Forming Method by Lithography

Either negative resist or positive resist is exposed by using ultraviolet rays, or X-rays, and the exposed resist is developed. Then, the developed resist layer is patterned, so that photonic crystal is formed. The patterning techniques with employment of the resist as either polymethyl methacrylate or novolac resin are described in, for example, Japanese Laid-open Patent Applications No. 6-224115 (1994) and No. 7-20637 (1995).

Also, the techniques capable of patterning polyimide by way of the photolithography are described in, for instance, Japanese Laid-open Patent Applications No. 7-181689

(1995) and No. 1-221741 (1989). Furthermore, the techniques capable of forming photonic crystal made of either polymethyl methacrylate or titanium oxide on a glass substrate by utilizing laser ablation are described in, for example, Japanese Laid-open Patent Application No. 10-59743 (1998).

(2) Forming Method by Stamping

The photonic crystal 70 may be formed by employing a hot stamping method with employment of thermoplastic resin (see Japanese Laid-open Patent Application No. 6-201907 (1994)), a stamping method with employment of ultraviolet hardening type resin (see Japanese Laid-open Patent Application No. 10-279439 (1998)), a stamping method with employment of electron beam hardening type resin (see Japanese Laid-open Patent Application No. 7-235075 (1995)), and so on (3) Forming Method by Etching While the lithography technique and the etching technique are utilized, a thin-films selectively removed to be patterned, so that the photonic crystal 70 can be formed.

The various forming methods of the photonic crystal 70 have been described. In summary, the photonic crystal may be constructed of at least two regions which own different refractive indexes from each other. For example, this photonic crystal may be formed by employing, for instance, a method of forming two regions by employing two sorts of materials having different refractive indexes from each other, and another method of forming two regions having different refractive indexes from each other by partially denaturing one sort of material.

Device Operation

Since operations of the light emitting device 300 according to this third embodiment are similar to those of the light emitting device 100 according to the first embodiment except that the light propagated along the surface direction of the substrate 10 is defined by the photonic crystal 70. descriptions thereof are omitted.

Effect

While the light emitting device 300 of the third embodiment owns operations and effects which are substantially similar to those of the light emitting device 100 of the first embodiment, since the photonic crystal 70 is formed in the second light emitting layer 40, the light propagated along the surface direction of the substrate 10 can be restricted in the second light emitting layer 40. This photonic crystal 70 is defined based upon the wavelength of the light generated in the second light emitting layer 40 As a result, the emissions of the light which is propagated along the surface direction of the substrate 10 can be restricted. Furthermore, the light generated in the first light emitting layer 20 can be utilized in a higher efficiency.

Fourth Embodiment

Device Structure

Figure 6:
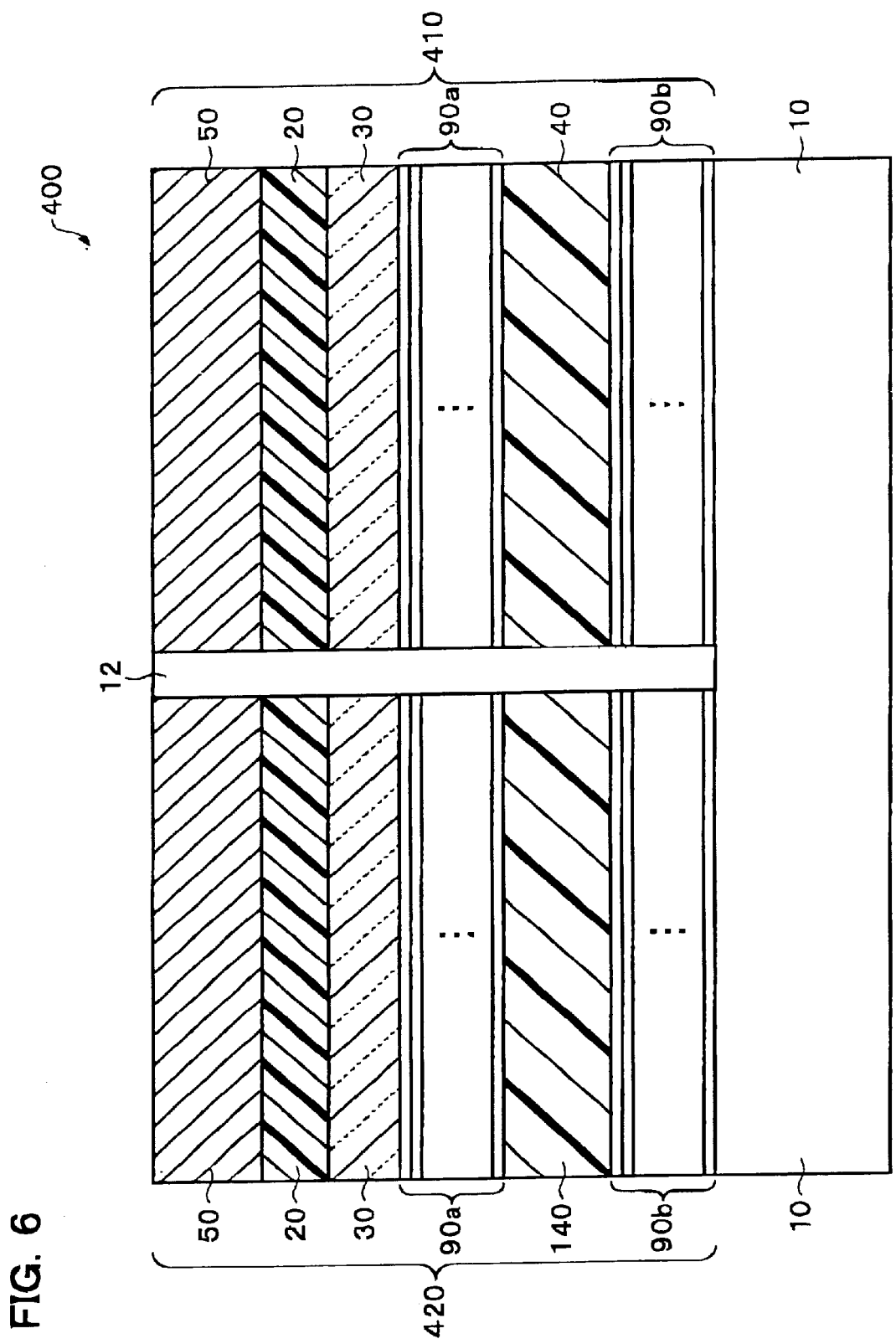
FIG. 6 is a sectional view for schematically representing a light emitting device according to a fourth embodiment of the present invention.

FIG. 6 is a sectional view for schematically indicating a light emitting device 400 according to a fourth embodiment of the present invention.

The light emitting device 400 of this fourth embodiment has a substrate 10, and light emitting element sections 410 and 420 formed on this substrate 10. The light emitting device 400 owns a different structure from that of the light emitting device 100 according to the first embodiment. That is, a plurality of light emitting element sections (light emitting element sections 410 and 420) are formed on the substrate 10. Other structural elements of this light emitting device 400 are similar to those of the light emitting device 100 according to the first embodiment, and therefore, descriptions thereof are omitted.

The light emitting element sections 410 and 420 are formed on the substrate 10, and are separated from each other by a bank 12 formed on the substrate 10. Second light emitting layers 40 and 140 are formed in the light emitting element sections 410 and 420, respectively. It should be noted that in this fourth embodiment, any layers other than these second light emitting layers 40 and 140 in the light emitting element sections 410 and 420 are formed by way of the same manufacturing steps, respectively.

The second light emitting layers 40 and 140 are formed at the same level. The second light emitting layers 40 and 140 have light emitting materials, the light emitting wavelengths of which are different from each other. As a result, the wavelength of the light generated in the second light emitting layer 40 is different from the wavelength of the light generated in the second light emitting layer 140. In this case, film thicknesses of dielectric multilayer films which are formed in the light emitting element sections 410 and 420 are defined based upon the wavelengths of the light generated in the second light emitting layers 40 and 140. As a consequence, the film thicknesses of the dielectric multilayer films which are formed in the light emitting element sections 410 and 420 respectively should be made as the film thicknesses corresponding to the wavelengths of the light generated in the second light emitting layers 40 and 140. As a result, in the case the wavelengths of the light generated in the second light emitting layers 40 and 140 are largely different from each other, there are some possibilities that a difference between the film thicknesses of the dielectric multilayer films which are formed in the respective light emitting element sections 410 and 420 may become large.

However, if high reflection factor ranges of the dielectric multilayer films 90a and 90b which constitute the light emitting element sections 410 and 420 are made wide, then these dielectric multilayer films 90a and 90b may be commonly employed in the light emitting element sections 410 and 420.

Also, since the high reflection factor ranges of the dielectric multilayer films 90a and 90b which constitute the light emitting element sections 410 and 420 are made wide, these dielectric multilayer films 90a and 90b maybe commonly employed in the light emitting element sections 410 and 420.

Device Operation

Operations of this light emitting device 400 according to the fourth embodiment are similar to those of the light emitting device 100 according to the first embodiment, and therefore, explanations thereof are omitted.

Effect

The light emitting device 400 according to this fourth embodiment owns a similar effect to that of the light emitting device 100 according to the first embodiment. Furthermore, in the case that while the high reflection factor ranges of the dielectric multilayer films 90a and 90b which constitute the light emitting element sections 410 and 420 are made wide, these dielectric multilayer films 90a and 90b are commonly used in the light emitting element sections 410 and 420, when the light emitting element sections 410 and 420 are formed, only the second light emitting layers 40 and 140 maybe separately formed by employing the ink-jet method and the like.

It should also be noted that when an organic compound is employed as the light emitting material which constitutes the first light emitting layer 20 in the light emitting device according to each of the above-described embodiments, a hole transport layer may be provided between the anode 30 and the first light emitting layer 20, if necessary. As a material of this hole transport layer, any proper material may be selectively employed from the hole injection materials of the known optical conductive material, or the materials used in a hole injection layer of an organic light emitting device. The material of the hole transport layer may have a function capable of injecting holes, or a function having a barrier characteristic of electrons, while this material may be made of either an organic material or an inorganic material. A concrete example of this material used in the hole transport layer may be exemplified in, for instance, Japanese Laid-open Patent Application No. 8-248276 (1996).

Also, an electron transport layer may be provided between the anode 50 and the first light emitting layer 20, if necessary. As a material of this electron transport layer. any material may be employed if this material has a function capable of transporting electrons injected from the anode 50 to the first light emitting layer 20, so that this material may be selected from the known substances. A concrete material example may be exemplified in, for example, Japanese Laid-open Patent Application No. 8-248276 (1996).

What is claimed is:

1. A light emitting device comprising:
   a substrate; and
   a light emitting element section formed over the substrate,
   wherein the light emitting element section includes:
      a first light emitting layer in which light is generated due to electroluminescence;
      one pair of electrode layers used to apply an electric field to the first light emitting layer;
      a second light emitting layer which absorbs light generated in the first light emitting layer and generates light having a longer wavelength than a wavelength of the absorbed light; and
      one pair of dielectric multilayer films which are formed under and above the second light emitting layer, respectively,
   wherein a wavelength range of light that is reflected by the pair of dielectric multilayer films includes a wavelength range of light generated in the second light emitting layer.

2. The light emitting device as defined in claim 1, wherein light generated in the second light emitting layer is emitted in a direction intersecting with the substrate.

3. The light emitting device as defined in claim 1, wherein a wavelength range of light generated in the first light emitting layer and a wavelength range of light absorbed by the second light emitting layer at least partially overlap with each other.

4. The light emitting device as defined in claim 1, wherein a wavelength at a highest emission intensity in a wavelength range of light generated in the second light emitting layer is longer than a wavelength at a highest emission intensity in a wavelength range of light generated in the first light emitting layer.

5. The light emitting device as defined in claim 1,
   wherein the pair of dielectric multilayer films include a first dielectric multilayer film and a second dielectric multilayer film,
   wherein the first dielectric multilayer film is formed closer to the first light emitting layer than the second dielectric multilayer film, and
   wherein a reflectance of the first dielectric multilayer film is larger than a reflectance of the second dielectric multilayer film.

6. The light emitting device as defined in claim 1, wherein the first light emitting layer includes an organic light emitting material which emits light by the electroluminescence.

7. The light emitting device as defined in claim 1,
   wherein the second light emitting layer includes a host material and a dopant material,
   wherein the host material absorbs light generated in the first light emitting layer so that an excited state occurs, and the dopant material is excited due to a transfer of the excited state of the host material to the dopant material, and
   wherein the excited dopant material emits light having a longer wavelength than a wavelength of light absorbed by the host material.

8. The light emitting device as defined in claim 1,
   wherein the second light emitting layer includes an organic light emitting material, and
   wherein the organic light emitting material absorbs light generated in the first light emitting layer so that the organic light emitting material is excited, and the excited organic light emitting material emits light having a longer wavelength than a wavelength of the absorbed light.

9. The light emitting device as defined in claim 1, wherein a propagation direction of light emitted from the first light emitting layer is substantially equal to a propagation direction of light emitted from the second light emitting layer.

10. The light emitting device as defined in claim 1, further comprising an optical member which collects light emitted from the first light emitting layer.

11. The light emitting device as defined in claim 10, wherein the optical member is formed between the first light emitting layer and the second light emitting layer.

12. The light emitting device as defined in claim 10, wherein the optical member is a lens layer of refractive index distribution type.

13. The light emitting device as defined in claim 1, wherein the second light emitting layer includes photonic crystal that restricts light propagated in a surface direction of the substrate.

14. The light emitting device as defined in claim 13, wherein a pitch of the photonic crystal is defined based on a wavelength of light generated in the second light emitting layer.

15. The light emitting device as defined in claim 1,
   wherein the light emitting device includes a plurality of the light emitting element sections, and
   wherein the second light emitting layers of the emitting element sections generate light having different wavelengthes.

16. The light emitting device as defined in claim 15, wherein the second light emitting layers are formed in the same level.

17. The light emitting device as defined in claim 15, wherein the light emitting element sections are separated from one another by a bank.

18. A display device to which the light emitting device as defined in claim 1 is applied.

19. An electronic instrument to which the display device as defined in claim 18 is applied.

20. An electronic instrument to which the light emitting device as defined in claim 1 is applied.

* * * * *